United States Patent [19]
Turner et al.

[11] Patent Number: 4,647,266
[45] Date of Patent: * Mar. 3, 1987

[54] WAFER COATING SYSTEM

[75] Inventors: George L. Coad, Lafayette; Martin A. Hutchinson, Santa Clara; R. Howard Shaw, Palo Alto; all of Calif.

[73] Assignee: Varian Associates, Inc., Palo Alto, Calif.

[*] Notice: The portion of the term of this patent subsequent to Jan. 19, 1999 has been disclaimed.

[21] Appl. No.: 523,817

[22] Filed: Aug. 15, 1983

Related U.S. Application Data

[62] Division of Ser. No. 106,343, Dec. 21, 1979.

[51] Int. Cl.$^4$ ............................................. C23C 15/00
[52] U.S. Cl. .................................. 414/225; 414/417; 198/339.1
[58] Field of Search ............... 414/225, 416, 417, 222, 414/223, 224, 330; 198/339, 345, 485; 294/99 R, 6, 28; 353/115, 116, 117

[56] References Cited

U.S. PATENT DOCUMENTS

| | | | |
|---|---|---|---|
| 1,377,027 | 5/1921 | Pettit | 369/189 |
| 2,501,391 | 3/1950 | Karp | 274/10 |
| 2,723,877 | 11/1955 | Palmour et al. | 294/28 |
| 2,865,643 | 12/1958 | Parker et al. | 279/106 |
| 3,272,350 | 9/1966 | Pflaumer et al. | 414/416 |
| 3,340,176 | 9/1967 | Belluso et al. | 204/298 |
| 3,521,765 | 7/1970 | Kauffman et al. | 414/217 |
| 3,625,384 | 12/1971 | Boerger et al. | 414/417 X |
| 3,721,210 | 3/1973 | Helms et al. | 118/48 |
| 3,780,892 | 12/1973 | Frank | 414/417 X |
| 3,856,654 | 12/1974 | George | 204/298 |
| 3,874,525 | 4/1975 | Hassan et al. | 414/225 |
| 3,893,838 | 10/1976 | Christensen | 118/49 |
| 3,926,323 | 12/1975 | Frank et al. | 414/417 |
| 3,938,886 | 2/1976 | Uchidoi et al. | 353/115 |
| 3,961,819 | 6/1976 | Yocum | 294/6 X |
| 3,981,791 | 9/1976 | Rosvold | 204/298 |
| 4,002,254 | 1/1977 | Olofsen | 414/416 |
| 4,047,624 | 9/1977 | Dorenbos | 414/217 |
| 4,068,814 | 1/1978 | Anthony et al. | 248/176 |
| 4,261,808 | 4/1981 | Walter | 204/298 |

Primary Examiner—Robert J. Spar
Assistant Examiner—Ken Muncy
Attorney, Agent, or Firm—Stanley Z. Cole; Leon F. Herbert

[57] ABSTRACT

An elevator structure is actuated to remove wafers individually out of a storage cassette to an elevated delivery position. The elevator is a lift blade with an arcuate upper end shaped to match the curvature of the wafers, and a groove within this end adapted to match the thickness of a wafer and retain a wafer edgewise. A wafer-holding chuck on a chuck assembly is adapted to receive a wafer from the elevator when the elevator is in the elevated delivery position. The chuck assembly is movable from the delivery position to a remote position where the chuck presents the wafer to a support member. The support member is provided with an aperture and a plurality of deformable wafer-holding clips spaced around the aperture. The chuck assembly includes a pneumatic cylinder capable of contacting a portion of each clip to urge same to an open position. The invention includes an arrangement in which the chuck is mounted on a chuck assembly in the form of a door for sealing an opening in a process chamber.

23 Claims, 15 Drawing Figures

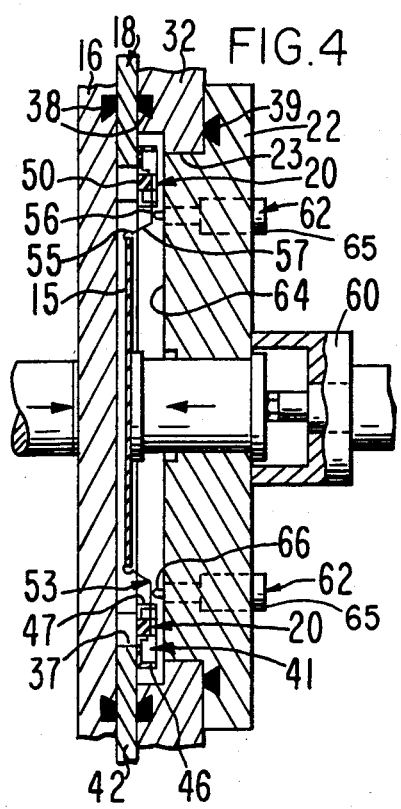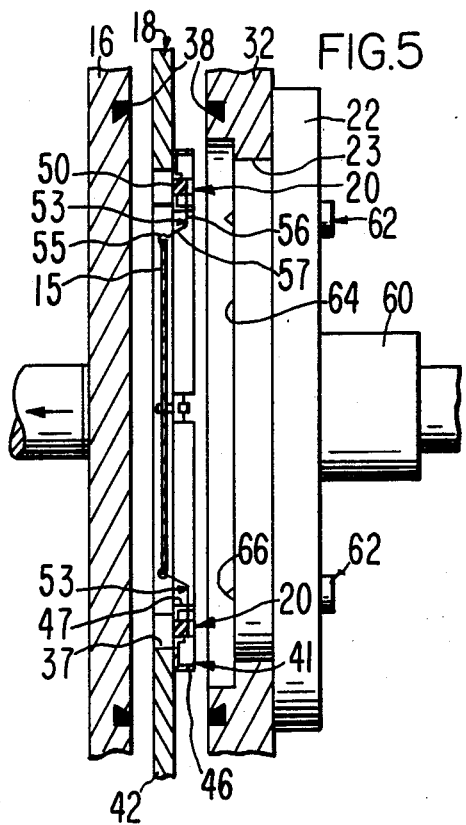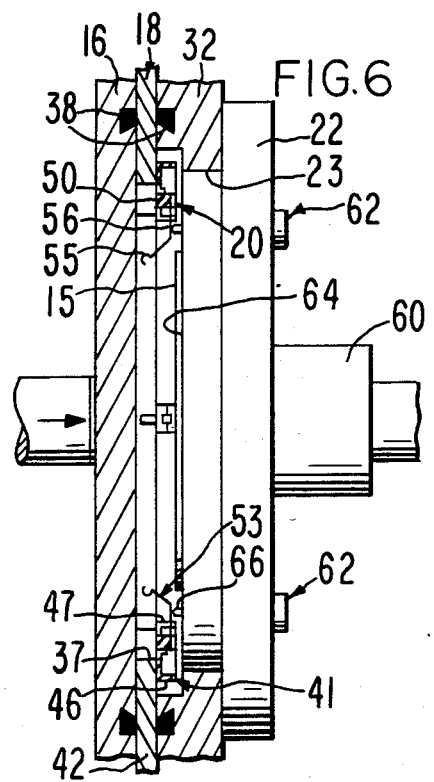

WAFER COATING SYSTEM

This application is a division of Ser. No. 106,343 filed Dec. 21, 1979.

BACKGROUND OF THE INVENTION

The present invention relates to the automatic transport of semiconductor wafers.

In the field of processing semiconductor wafers it is desirable to minimize manual contact with the wafers in order to avoid contamination of the wafers, the expense associated with use of skilled personnel and the possibility of human error. Also, in the field of processing semiconductor wafers there are many systems which involve the need for removing the wafers from a storage cassette and relocating them such that each wafer can be processed individually.

Accordingly, an object of the present invention is to provide a new and improved type of automatic system for transporting generally circular, relatively thin semiconductor wafers from a storage cassette to a remote support where individual wafers are held in a manner such that at least one side of the wafer is exposed for subsequent processing on such support.

Another object of the present invention is to provide automatic transport of generally circular, relatively thin semiconductor wafers wherein such wafers are maintained in substantially vertical orientation throughout the transport sequence.

SUMMARY OF THE INVENTION

The objects of the invention are accomplished in a preferred embodiment with the following transport system. An elevator structure is actuated to remove wafers individually out of a storage cassette to an elevated delivery position. In the preferred embodiment, the elevator is a lift blade with an arcuate upper end shaped to match the curvature of the wafers, and a groove within this end adapted to match the thickness of a wafer and retain a wafer edgewise therewithin.

A wafer-holding chuck on a chuck assembly is adapted to receive a wafer from the elevator when the elevator is in the elevated delivery position. The chuck assembly is movable from said delivery position to a remote position where the chuck presents the wafer to a support member. The support member is provided with an aperture and a plurality of deformable wafer-holding clips spaced around the aperture. The chuck assembly includes means for actuating the clips to an open position when the chuck presents a wafer to the support member. In the preferred embodiment the clips are spring biased to resume a closed position for gripping the wafer when the clip-actuating means retract. Since some semiconductor systems include a processing chamber having an opening for receiving wafers and a need to close the outside of the opening after wafers are inserted, one aspect of the invention includes an arrangement in which the chuck is mounted on a chuck assembly in the form of a door in which the chuck is centrally located to provide plural function of fully automatic transport of a wafer from a cassette into the openng in a process chamber plus simultaneous sealing of the outside of the opening. For purposes of showing how the wafer transport apparatus functions with one type of wafer processing system, a sputter coating system is disclosed.

BRIEF DESCRIPTION OF THE DRAWINGS

FIG. 4 is a cross-sectional elevational view of the door and load lock of FIGS. 1 through 3, showing the manner in which the door assembly loads a wafer into the load lock, and the manner in which the load lock is sealed from the remainder of the processing chamber interior;

FIG. 5 is a view similar to FIG. 4, showing the relative positions of the elements of the load lock upon completion of loading of the wafer therewithin;

FIG. 6 is a view similar to FIGS. 4 and 5, showing the position of the wafer and the load lock elements just subsequent to the extraction of a wafer from the internal wafer support assembly, and prior to the opening of the door, or just before the loading of a wafer into the internal wafer support assembly immediately after closure of the door for loading.

DETAILED DESCRIPTION

Figure 1:
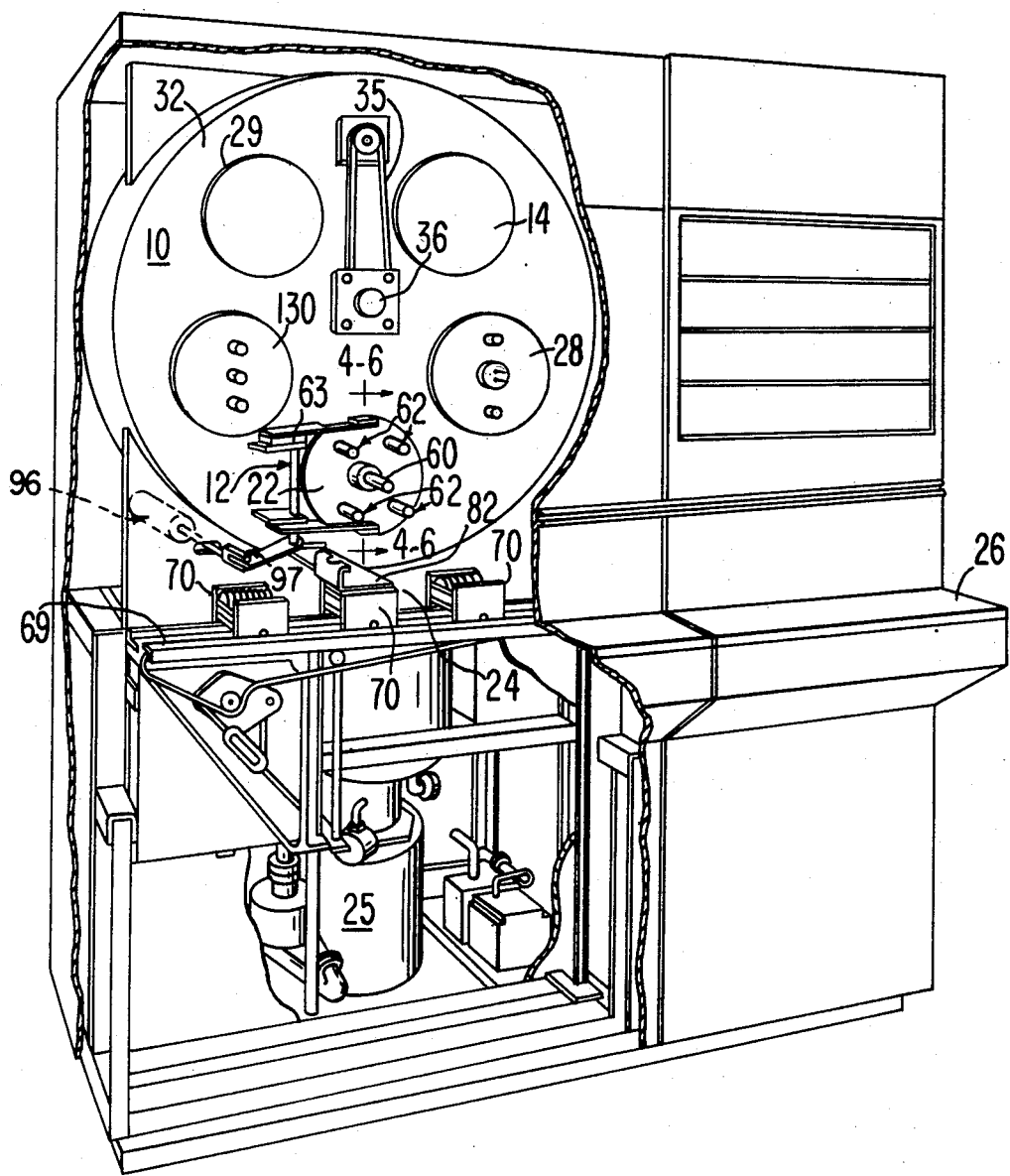
FIG. 1 is an elevational view of a complete wafer coating system utilizing the wafer transport invention, showing a main cylindrical processing chamber, the door arrangement at a entrance of the load lock to the chamber, and four remaining work stations of the processing chamber, together with portions of the wafer cassette load/unload assembly.

The wafer coating system of FIG. 1 principally includes a generally cylindrical vacuum processing chamber 10 and having five work stations, one of which comprises load lock arrangement 12; and one of which comprises coating station 14. Remaining further elements of the coating system found within chamber 10 may be seen in more detail in FIG. 2, which also shows a wafer 15 within load lock 12; and also a wafer at coating station 14. Further elements include pressure plate 16, wafer carrier plate assembly 18, and clip assemblies 20 (better shown in FIG. 3), by which a wafer is retained within wafer carrier plate 42 of carrier plate assembly 18. Door assembly 22, which seals the entrance opening 23 of chamber 10, and which cooperates with the just mentioned elements to form the chamber load lock arrangement 12, completes the principal elements of processing chamber 10. These elements, together with cassette load/unload assembly 24 and the various ancillary vacuum pumps 25 for chamber and load lock evacuation, and control means, are all housed compactly in cabinet 26.

The system desirably includes several other work stations other than load lock arrangement 12 and coating station 14, in particular wafer heating station 28, auxiliary station 29, and wafer cooling station 130. All five work stations are equally spaced laterally from each other and from the central axis 36 of the vacuum chamber. Although five stations are provided, the design could be equally well adapted to both a greater or fewer number of stations. Also included are at least two pneumatic rams 30 and 31 which function to drive pressure plate 16 and wafer carrier plate assembly 18 against the front wall 32 of chamber 10, and carrier plate drive 35, which centrally mounts carrier plate assembly 18, which is circular and of nearly the diameter of front wall 32, for rotation about the central axis 36 of the vacuum processing chamber.

In general, wafers are individually presented and loaded by door assembly 22 into load lock arrangement 12 and thereby within wafer carrier plate 18. The wafer is then passed in turn to each of the work stations, where it is heated for completion of outgassing and/or sputter-etch cleaned, coated, optionally coated with a second layer, cooled, and then returned again to load lock 12 for removal from wafer carrier plate assembly 18, again by door assembly 22. Although the foregoing generally-described system is a rotary one and a multi-station one, the load lock and coating steps are equally applicable to a single station or dual station configuration, or a non-rotary or in-line arrangement as well.

Now considering the system in more detail from the view point of an incoming wafer, the load lock arrangement 12 through which a wafer 15 must be passed in order to enter the evacuated environment of the chamber is of key importance. FIGS. 4-6 are especially important in appreciating the operation of the movable elements of load load 12. As pointed out above, the load lock is defined by a sandwich arrangement of elements between the chamber door assembly in its closed position against the front wall of the processing chamber and the pressure plate in its driven position. The load lock is built around a circular aperture 37 within wafer carrier plate assembly 18, which is positioned internally of the chamber just inside the chamber entrance 23 associated with load lock 12, with plate assembly 18 generally parallel to wall 32 and the pressure plate 16, positioned within the chamber rearwardly of plate assembly 18. Wafer 15 is loaded and held within the load lock and within the plate assembly by means which will be described below. The controlled subatmospheric environment which may be provided within chamber 10 for certain wafer processing operations may be, for example, up to 20 microns of argon or other inert gas for sputter coating operations. Because of this evacuated environment, the load lock region must be sealed off from the remainder of the chamber interior whenever door 22 is open in order to preserve the evacuated environment. Pressure plate 16 serves the function of isolating the load lock area from the chamber interior (and also several other functions simultaneously at other work stations, as will be shown below). Pneumatic rams 30 and 31, mounted to the rear plate of the processing chamber, drive the pressure plate and carrier plate assembly against front chamber wall 32, with pneumatic ram 30 being applied particularly to the pressure plate concentrically with load lock arrangement 12 to effect the sealing of the load lock. Both pressure plate 16 and chamber front wall 32 are equipped with O-rings 38 arranged in a circular pattern concentric with chamber entrance 23 to provide vacuum seals in the sandwich arrangement of elements defining the load lock. Chamber door assembly 22, which in its closed position seals against the outside surface of chamber front wall 32 and also includes a concentric O-ring 39 to provide the vacuum seal, completes the load lock by sealing off the chamber entrance 23 from the outside atmosphere. FIGS. 4 and 6 show the completed load lock, with pressure plate 16 in its forward, advanced position, compressing plate assembly 18 against chamber wall 32, and sealing off aperture 37; and door 22 closed to seal off chamber entrance 23 to form the load lock about aperture 37, which is only of a size no larger than necessary to accommodate a single wafer. It may be seen that an unusually thin low-volume load lock is thereby defined with a minimum of elements, and of a minimum size necessary to accommodate wafer 15 therewithin. For further details of the load lock arrangement, see the commonly owned U.S. Pat. No. 4,311,427 "Wafer Transport System". FIG. 5 shows pressure plate 16 in its withdrawn, rest position, and with the wafer already secured within plate assembly 18 within the chamber.

Figure 2:
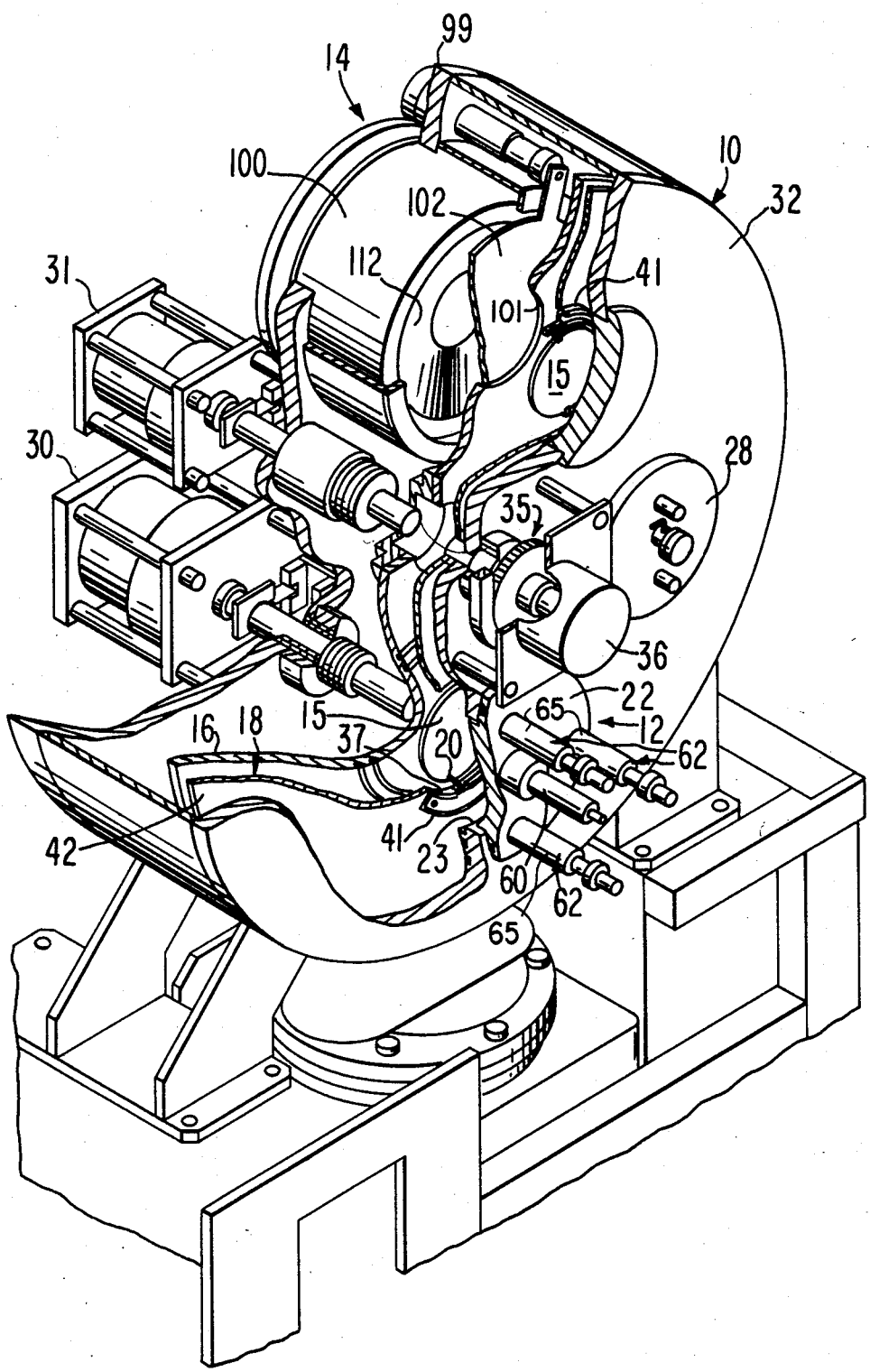
FIG. 2 is a broken-away perspective view of the processing chamber of FIG. 1, showing the load lock and sputter coating stations in more detail.

Cooperating with this thin load lock arrangement is wafer carrier plate assembly 18, which includes a plurality of circular apertures such as at 37 (as best seen in FIG. 2) matching the number and spacing of work stations within chamber 10. The apertures 37 are of a diameter larger than the wafers, are equally spaced from each other, and centered at the same radial distance from the central axis of the processing chamber. The aforementioned work stations are likewise spaced, so that when any aperture of the wafer carrier plate assembly 18 is aligned with any work station of the processing chamber, the remaining apertures are each similarly aligned with a respective one of the remaining work stations. Thus, if a wafer is secured within each of the apertures of carrier plate assembly 18, each of such wafers can be individually processed at a work station simultaneously with the processing of other wafers respectively at the remaining work stations. In this manner, a wafer is individually processed at a given station, yet during the same time, several other wafers may also undergo other operations at the remaining work stations. In particular, while a wafer is being unloaded and/or loaded at load lock 12, another wafer may be coated at coating station 14, while still another wafer may be heated at heating station 28. Carrier plate drive 35 intermittently operates to move plate assembly 18 by the distance of one station so as to serially present each of the wafers in turn to each of the processing stations in a counterclockwise direction, until a given wafer finally returns to the load lock for unloading therefrom.

As the wafer is transported from work station to work station as above described, it is important that the wafer be supported within carrier plate assembly 18 so as to avoid any risk of mechanical damage and abrasion due to being moved about, and generally so as to be protected from mechanical shock, vibration, and abrasion. To this end, wafer carrier aperture 37 is of a diameter such that both a wafer and a set of clip assemblies 20 can be accommodated within the periphery of the aperture, and recessed and parallel with the carrier plate, thereby protecting the wafer. The set of thin edgewise-acting clip assemblies also is important to the formation of the thin load lock arrangement 12, and edgewise resiliently supports the wafer in an upright position within plate assembly 18. An especially advantageous form of such an edgewise acting clip assembly is shown in cross section in FIGS. 4 through 6. For further details of the clip assembly see the commonly owned U.S. Pat. No. 4,306,731 "Wafer Support Assembly." A set of four clip assemblies 20 is mounted within retaining rings 41 which are removably attached to the disc-like circular wafer carrier plate 42 concentrically with each of plate apertures 37, thus forming the complete wafer carrier plate assembly 18. This arrangement mounts a set of clip assemblies 20 in spaced relationship within the periphery of each circular aperture 37. Retaining rings 41 are of U-shaped cross section, with each having flanges 46 and 47 defining the inner and outer peripheries thereof, and clip assemblies 20 are recessed within these flanges. Although it is preferred that four clip assemblies be used within an aperture 37, it is possible to use three, or a number greater than four. However, a set of four has been found to provide greater relability than three.

As may be seen in any of the FIGS. 4 through 6, clip assemblies 20 each include a block 50 of generally, rectangular cross section, which may be of insulating material for applications such as sputter etch for which electrical isolation of the wafer is desired, and an elongated spring clip 53 firmly engaged in wraparound fashion about block 50. Each clip 53 includes at the end thereof opposite the block an arcuate finger portion or tip 55, which is of a curvature in radius appropriate to gripping an edge of a wafer. Extending from block 50 is proximal flat portion 56, which lies within a plane closely adjacent and parallel with the plane defined by plate aperture 37. On the other hand, distal portion 57 is angled away from portion 56 down toward the plane of plate aperture 37, and defines an obtuse angle with portion 56. This clip arrangement results in a plurality of arcuate tips 55 lying on a circular pattern of diameter somewhat less than that of a typical wafer 15 (such circular pattern also lies within the plane of wafer carrier plate 42).

Wafer insertion into load lock 12 may be effected manually by simply pushing a wafer by its edge or rear face into clip assemblies 20. This will, however, involve some edge rubbing of the wafer against distal portion 57, to spread apart the clips somewhat to accept the wafer within tips 55. In order to insert a wafer without such rubbing contact therewith, the clips must first be slightly spread, and then allowed to rebound against the edge of the wafer upon insertion thereof into the load lock. Although both wafer insertion and clip spreading may be done manually, it is far preferable to avoid all such manual operations, and the consequent added risk of damage, error, and contamination associated therewith. Chamber door assembly 22 carries thereon a vacuum chuck 60 centrally axially therethrough, and a plurality of clip actuating means 62 near the periphery thereof. These elements, along with wafer cassette load/unload assembly 24, provide an automated wafer loading and unloading arrangement for load lock 12 which avoids all such manual handling of the wafers, and automates the loading process.

Figure 3:
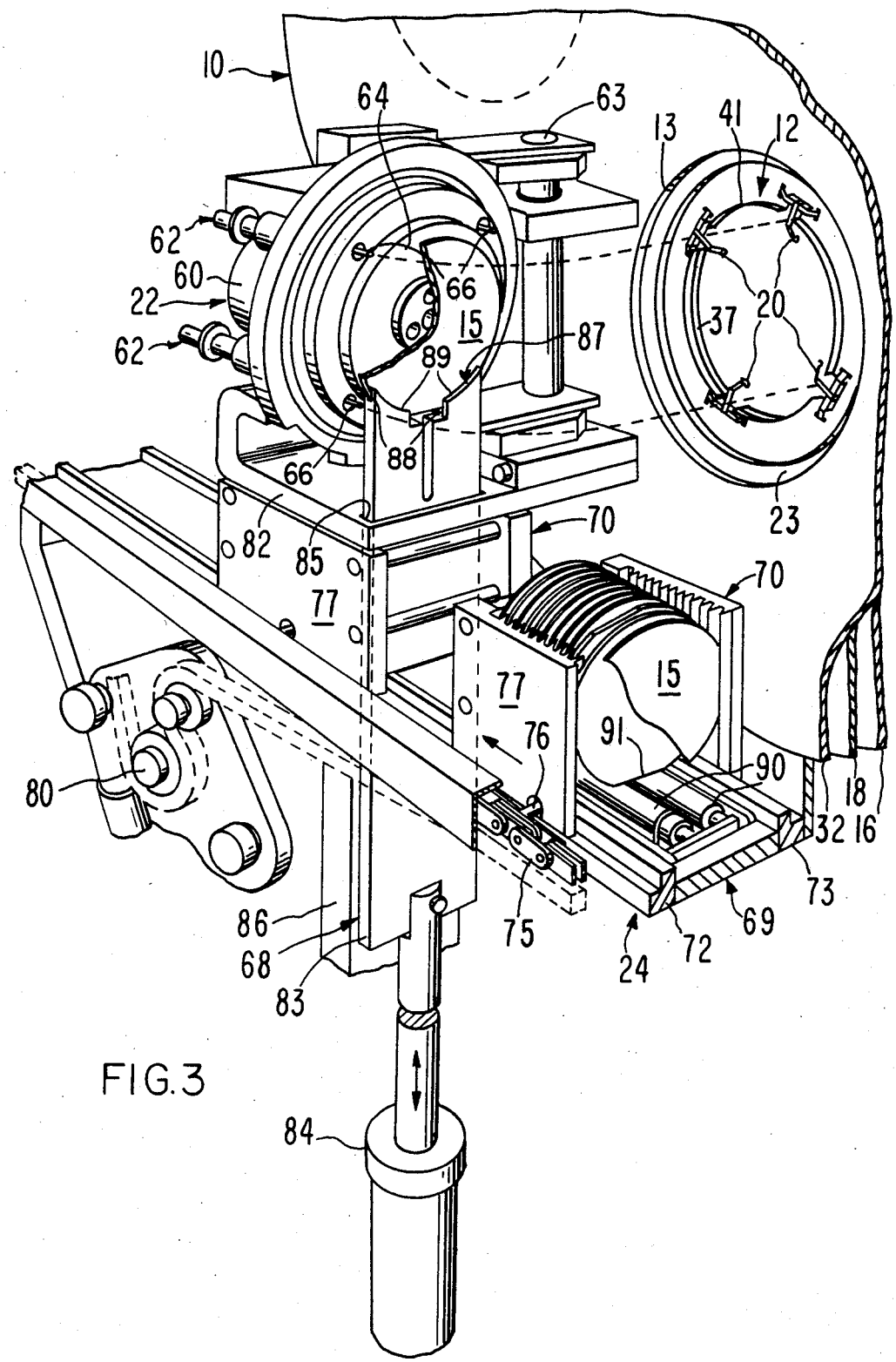
FIG. 3 is a perspective view of the cassette load/unload assembly of FIG. 1, showing its manner of cooperation with cassettes of vertically-oriented wafers and the door assembly of the processing chamber, and the manner in which wafers are transferred therebetween and into the chamber load lock.

As thus seen in FIGS. 1 and 3, chamber door assembly 22 is attached to front wall 32 of chamber 10 by a heavy-duty hinge 63 having a vertical axis, to allow the door to open and close in a conventional manner to a fully open position as shown, wherein the door and its inside face 64 are vertical and perpendicular to the plane of chamber entrance 23, as well as to plate assembly 18. As shown in FIG. 1, door assembly 22 is moved between its open and closed positions by means of a conventional push-pull actuator 96, and pivot linkage 97 which is attached to hinge 63 for causing rotation of the hinge and door. Vacuum chuck 60, which extends axially and centrally through the door so that the active end thereof forms part of the inside face 64 of the door, engages a wafer presented vertically to the inside face of the door and holds the wafer by vacuum suction as the door is closed, whereupon the vacuum chuck axially extends from the inner door face as shown in FIG. 4 to carry the wafer into engagement with clip assemblies 20. The vacuum chuck will then withdraw, and wafer 15 is held in the chamber by the clip assemblies and undergoes processing, and movement to the various work stations in turn by rotation of plate assembly 18. In this preferred embodiment, the vertical presentation of the wafer to the inside face 64 of the door is effected by load/unload assembly 24, as will be further detailed below.

It should be noted that the load lock arrangement, wafer carrier plate assembly 18, and door assembly 22 need not be limited to a vertical orientation, although this is preferred to help obviate any possibility of debris settling upon a surface of the wafer. The clip assembly, carrier plate and load lock arrangement of the invention, as well as all of the work stations, function equally well if oriented horizontally. Indeed, although the load/unload assembly 24 for the vertically-oriented wafer cassettes is meant for vertical operation, the door assembly 22 could easily be made to load wafers into the load lock in a horizontal plane, yet accept wafers in a vertical orientation, by suitable modification of its manner of mounting to the chamber wall in a conventional manner.

As noted above, it is preferable to avoid simply loading a wafer into the clip assemblies 20 within the load lock by pushing a wafer against the angled distal portion 57 of the clips. In order to insert a wafer without such rubbing contact, the clips must first be slightly spread, and then allowed to rebound against the edge of the wafer upon insertion thereof into the load lock. This is accomplished automatically as the wafer is being inserted by vacuum chuck 60 by four clip actuating means 62 mounted within the door as aforementioned. Each clip actuating means 62 is mounted so as to be in registration with a corresponding one of clip assemblies 20 when the door is in its closed position. Each clip actuating means 62, shown in detail in FIG. 4, includes an pneumatic cylinder 65, a contact pin 66 which moves axially inwardly and outwardly, and is propelled by cylinder 65, and axial seals for the pin. Pins 66 are each in registration with one of flat proximal clip portions 56 when the door is in its closed position. With door 22 closed, pins 66 are extended just prior to insertion of a wafer; or as a wafer is to be withdrawn. The pressure of a pin 66 against the facing flat clip proximal portion 56 presses the clip and causes the tip 55 to swing back and outwardly, thereby releasing the clips, to facilitate insertion or removal of a wafer without rubbing contact therewith.

During wafer unloading after completion of the wafer processing, these operations are reversed, with the chuck again extending and applying vacuum to the backside of the wafer to engage same, with the clip actuating means again cooperating to release the clips, whereupon the door opens and the chuck retains the wafer on the inside face of the door by vacuum suction until the wafer is off-loaded by load/unload assembly 24.

As we have seen, when in its fully opened position, door assembly 22 is poised to accept a wafer for insertion into the load lock arrangement 12, or it has just opened and carried a finished wafer from load lock 12, which must then be unloaded from the vacuum chuck. The function of presenting a wafer to the door assembly 22 for loading, or for removing a processed wafer therefrom for unloading, is performed by cassette load/unload assembly 24, which includes wafer elevator assembly 68 and wafer cassette conveyor assembly 69. Extending below and on either side of chamber entrance 23 and attached to wall 32 of the chamber is the conveyor assembly, which moves cassettes 70 of wafers generally along from the right of the entrance as shown in FIG. 1 to left. The cooperating wafer elevator assembly 68 lifts wafers individually from the cassettes conveyed by conveyor assembly 69 to the operative end of vacuum chuck 60 within the inside face 64 of door assembly 22, or lowers such wafers from the door upon completion of processing.

Conveyor assembly 69 includes a spaced pair of parallel rails 72 and 73 extending horizontally and longitudinally across the front of wafer processing chamber 10. The rails support and convey cassettes 70, and the spacing of rails 72 and 73 is such that the sidewalls of the cassettes straddle the rail and enable the cassettes to be slidably moved along the rails across the conveyor assembly. Motive power for the movement of the cassettes is provided by chain drive means 75 which includes various guides and gear arrangements causing a roller chain to be moved alongside rail 72. The chain is provided at regular intervals with guide pins 76, which engage a matching cutout on the bottom of cassette wall 77 adjacent rail 72. Thus, the cassette is caused to move at the same rate as the chain toward and away from elevator assembly 68, as required. A stepper motor means 80 is provided as the driving power for the chain means 75, to provide precise control over the movement of the cassettes, so that any chosen indvidual wafer within a cassette may be positioned for interaction with the wafer elevator assembly 68. A conventional memory means is coupled to stepper motor 80 and wafer elevator assembly 68, which stores the location of an individual wafer within a cassette. Thus, although several further wafers may have been loaded into processing chamber 10 and the cassette accordingly advanced several positions since a first wafer was loaded, yet upon emergence of the completed first wafer, the stepper motor may be reversed the required number of steps to return the completed wafer to its original position, then again resume its advanced position to continue its loading function.

The cassettes 70 hold a plurality of the wafers 15 in spaced, facing, aligned and parallel relationship, and are open at the top as well as over a substantial portion of their bottom, to permit access from below and above the wafers. They must be loaded so that the front faces of the wafers, which contain the grooves, steps, and other features defining the microcircuit components, face away from the inside face 64 of the open door 22, and so that the rear faces of the wafers face toward the door assembly. This ensures that when the vacuum chuck 60 engages the wafer, no contact is made with the front face containing the delicate microcircuits, and that the wafer is properly positioned upon insertion into the load lock 12 so that it will be oriented properly with respect to processing equipment within the processing chamber 10.

The wafer elevator assembly 68 is positioned below and just to the left side of chamber entrance 23 and includes an upper guide plate 82, a blade-like elevator member 83, and an actuating cylinder 84 connecting to the lower end of member 83. Elevator blade member 83 is guided for movement up and down in a vertical path intersecting at right angles conveyor 69 between rails 72 and 73 to inside face 64 of door 22. Guide slot 85 in guide plate 82 just below the inside face of the door in the open position provides the uppermost guide for blade 83, while a vertical guide member 86 extending below the conveyor toward the actuating cylinder also aids in retaining blade 83 on its vertical path. The width of blade 83 is less than that of the spacing between rails 72 and 73, and also less than the spacing between the main walls of the cassettes 70 which straddle rails 72 and 73. Blade 83 is also thinner than the spacing between adjacent wafers retained in cassettes 70.

Blade member 83 is further provided with an arcuate upper end 87 shaped to match the curvature of the wafers, and a groove 88 within this end adapted to match the thickness of a wafer and retain a wafer edgewise therewithin. The grooved upper end 87 is in the form of two spaced-apart upper projections 89. Thus, elevator blade member 83 passes between guide rails 72 and 73 and intersects conveyor and cassette at right angles thereto, upon stepper motor means 80 and chain drive 75 bringing a cassette and wafer into registration over the path of the blade. As may be seen, the cassettes are constructed to allow access from below to the wafers, and to allow elevator blade 83 to pass completely therethrough. Accordingly, upon stepper motor means 80 and chain means 75 placing a cassette and wafer in registration over the path of the blade, blade 83 moves upwardly between the conveyor rails to engage from below a wafer within the groove of its upper end 87, and elevate the wafer upwardly to a position in registration concentrically with and immediately adjacent inside face 64 of chamber door 22 in its open position. Note that since the wafers are vertically oriented, gravity aids in holding the wafers firmly yet gently and securely in the grooved end 87 of the blade. Contact with the delicate front face of the wafer, upon which the delicate microcircuits are defined, is therefore virtually completely avoided, unlike the case of typical automated handling when the wafer is in a horizontal orientation. Thus the risk of damage or abrasion to the wafer is greatly lessened.

Upon arrival of the wafer at the door 22, vacuum chuck 60 engages wafer 15 at its rear face by suction, and elevator blade 83 then is lowered through guide slot 85 and the cassette to a point below conveyor 69. Door 22 then closes with the wafer retained by the chuck 60, and the wafer is thereby loaded into the load lock arrangement 12 and chamber entrance 23 sealed simultaneously as described above for processing within chamber 10. Prior to completion of processing for wafer 15, still further wafers may be loaded within the remaining ones of apertures 37 of plate assembly 18; therefore the stepper motor and chain drive step the cassette one wafer position to move the next wafer serially in position over blade 83. Blade 83 then rises to repeat its operation of moving this next wafer upwardly to the open door, whose vacuum chuck then again engages that wafer for insertion into the load lock. Meanwhile, upon completion of processing for original wafer 15 by rotation in turn to each station, it is again at load lock 12, and vacuum chuck 60 again extends to the backside of the wafer while the door is still in its closed position, and clip actuating means 62 simultaneously depress the clips to disengage same from the wafer to enable the removal thereof by chuck 60, whereupon the door is opened and the wafer again positioned over the path of blade 83. Meanwhile, stepper motor means 80 and chain means 75 move the cassette back so that the original position of wafer 15 is presented over the blade path. Blade 83 then rises through conveyor rails 72 and 73 and slot 85 upwardly to engage the lower edge of wafer 15, whereupon chuck 60 releases the wafer, and enables blade 83 to lower the wafer back into its original position within the cassette. The cassette is then propelled forward to the position of the next wafer to be processed serially.

Prior to the elevation of the individual wafers by the elevator assembly 69 and loading into the load lock, it is desirable to insure a standard orientation for the wafers, so that the usual guide flat 91 across a cord of each wafer is aligned to be lowermost in the cassettes. In this manner, each of the wafers is assured of assuming the same position with respect to the processing equipment within the chamber. Further, making certain that the guide flat is in a given predetermined position assures that clip assemblies 20 within plate assembly 18 will function properly, and not accidently engage a flat of the wafer instead of a portion of the main circular edge. To ensure such standard orientation, a pair of opposed rollers 90 is provided which are longitudinally extended along and between rails 72 and 73 so that the roller axes are parallel with the rails. The rails are positioned in the path of the cassettes just prior to the position of the elevator assembly 68, so that orientation of the wafers is completed prior to their reaching the elevator assembly. Upon passage of the cassette over the rollers, the rollers are elevated and then are driven serially and in opposed senses, one clockwise and the other counterclockwise, and lightly contact the circular edge of the wafers. Contact with moving rollers 90 then has the effect of rotating the wafers within the cassettes until the guide flat 91 of each wafer is positioned at a tangent to the moving rollers, whereupon contact with the roller is lost and the wafers are all positioned with guide flats facing downwardly and in alignment, whereupon the rollers 90 are retracted downwardly.

As aforementioned, pressure plate 16 is driven against carrier plate 42 and wall 32 whenever door 22 is in its opened position, to protect the evacuated interior environment of the chamber from the atmosphere. We have seen that FIGS. 4 and 5 show in more detail the relative positioning of the pressure plate and wafer carrier plate, with FIG. 4 showing the aforementioned sandwich arrangement of the elements defining the load lock arrangement 12, and FIG. 5 showing the relative positioning of the elements when the pressure plate is in its withdrawn position. Note also that FIG. 4 shows vacuum chuck 60 in its extended position as the wafer is inserted into clip assemblies 20 with pins 66 of clip actuating means 62 partially extended after having spread the clips; while in FIG. 5, the vacuum chuck has withdrawn, as have the pins of the clip actuating means, and the wafer is now securely mounted in wafer carrier plate assembly 18. With pressure plate 16 withdrawn, the wafer is now ready to be rotated to subsequent processing stations. In FIG. 6, the vacuum chuck is also in the withdrawn position; however, the vacuum suction is operative, and the wafer is shown in its position against the inner face 64 of chamber door 22. This is, of course, the position of the elements of the load lock and the wafer just after the wafer has been withdrawn from clip assemblies 20, prior to its being removed from the load lock; or, it also represents the position of the elements just after the door has been closed and the vacuum chuck has not yet advanced the wafer to its position within aperture 37 of the wafer carrier assembly. Pins 66 of the clip actuating means 62 are shown bearing upon the clips just prior to depressing same to spread the clips in order to accept the wafer therewithin.

Upon completion of loading of the load lock with a wafer 15, the load lock is rough-pumped during a cycle lasting much less than a minute down to a level which, though still a good degree less evacuated when the chamber, does not appreciably disturb the chamber environment when the pressure plate is withdrawn as shown in FIG. 5, and the wafer 15 rotated to the next work station. This may be effectively done in such a short time frame not only because the load lock is of such small volume compared to the chamber (being only essentially that required to contain the wafer itself), but also because the outgassing load which was introduced therein is essentially only that of the wafer surfaces themselves, since no ancillary support equipment is utilized from sources outside of the load lock region, and since in any event the area of the clip assemblies supporting the wafer within the chamber is small relative to the wafer. This should be contrasted with the situation of prior art systems in which platens and other outside supports are introduced into the load lock, which supports have considerable area which contributes very greatly to the gas pumpdown load. Of course, the lack of such supports introduced from the outside also contributes significantly to a lessened risk of contamination. It should also be noted that the situation gets even better as the wafer advances to the subsequent work stations, since that portion of the pressure plate at the load lock region which is exposed to atmosphere (or the loading environment, which preferably is enclosed in a dry nitrogen environment) does not rotate with the wafer, but rather remains in the same loading station location, away from the remaining work stations and moreover is sealed off from the chamber environment during deposition.

While a wafer is being loded into and/or unloaded from load lock station 12, pressure plate 16 is in its active advanced position of FIG. 4, whereby plate assembly 18 is forced against front wall 32 of the chamber, and the pressure plate is similarly urging wafers in the remaining stations into contact, or closer working cooperation with the processing devices at those stations. For at the coating station 14 (as shown in FIG. 2), a sputter source 100 is mounted on the back plate 99 of the chamber and includes a ring-shaped target 112. An aperture 101 of circular form is made within the pressure plate, to enable the sputtering source to direct coating therethrough to a wafer advanced by carrier plate assembly 18 into registration at the coating station. A shutter 102 is also provided to enable the coating material to be blocked during rotation of the carrier plate assembly and when a wafer is not present at the coating station.

The final station to which wafer 15 is advanced is the load lock station 12, from which the wafer is removed and returned by means of load/unload assembly 24 to the same slot in the cassette 70 from which it originally came. The entire load/unload operation was described in detail earlier.

The preferred embodiment of the apparatus of this invention includes a plurality of processing stations for heating, coating, cooling and the like, and a wafer carrier plate assembly 18 for transporting wafers on an individual basis from station to station. There are many advantageous features inherent in the single wafer concept with the wafer close coupled and stationary with respect to the deposition source.

For certain applications, an alternative embodiment includes an apparatus in which the wafer or other substrate remains affixed to the load lock door during processing, the wafer carrier plate assembly being eliminated. A gate valve on the high vacuum side of the load lock provides communication between the wafer and the deposition source. A typical operation might include, for example, the steps of: wafer loading; wafer heating (or, alternatively, application of r.f. sputter etch); deposition from a sputtering source; wafer cooling; and wafer unloading. Gas conduction heat transfer could be advantageously employed to accelerate heating and cooling, and to provide control of wafer temperature during deposition. Although the apparatus of this embodiment lacks some of the versatility and high production rate capability of the preferred embodiment, it does have several appealing features, including: inherent simplicity and reliability; no wafer transport inside the vacuum system; and the wafer load at risk is at the irreducible minimum of one.

In the preferred embodiment of the apparatus of this invention, the wafer 15 is presented vertically to the inside face of chamber door 22, where it is engaged by vacuum chuck 60. Vacuum chuck 60 and clip actuating means 62 are mounted within chamber door 22. Chamber door is the outer door of load lock arrangement 12.

In some applications it may be desirable to separate the wafer loading/unloading means from the vacuum sealing means. Accordingly, a further embodiment is one in which the wafer loading/unloading means retracts after loading the wafer into wafer carrier plate assembly 18, following which a separate O-ring-sealed door is brought into position to effect the outer seal for the load lock.

We claim:

1. Apparatus for moving generally circular, relatively thin semiconductor wafers one at a time from a storage position in a cassette to a position where the wafers are individually loaded on a support in a manner such that each wafer is exposed and thus available for subsequent processing, said apparatus comprising:

cassette means configured to hold a plurality of wafers oriented vertically and spaced from each other in a horizontal plane;

wafer elevator means supported for vertical movement and including means for holding a wafer against the force of gravity;

means for moving said elevator means into said cassette means to engage a wafer and then upwardly above the cassette means to a delivery position in which a wafer on the elevator means is elevated from said cassette means;

a wafer-holding chuck assembly comprising wafer-holding chuck means adapted to hold a wafer in substantially vertical orientation;

means for moving said chuck means between first and second positions, said first position being such that said wafer-holding chuck means is positioned above a wafer in said cassette means to enable said chuck means to receive a wafer from said elevator means when said elevator means is moved upwardly to said delivery position;

wafer-receiving means spaced from said cassette menas, said wafer-receiving means comprising a support structure and clip means mounted on said support structure, said clip means forming a generally circular opening for holding a wafer in substantially vertical orientation;

said clip means including a radially inner portion adapted to contact a wafer, said clip means being adapted for movement of said inner portion toward and away from a wafer-receiving open position and a wafer-gripping closed position, said closed position being such that said inner portion grips the periphery of a wafer, whereby at least one face of the wafer is substantially exposed;

said second position of said chuck means being such that said wafer-holding chuck means presents a wafer to said clip means;

said chuck assembly further comprising clip-actuating means, said clip-actuating means being mounted on said chuck assembly such that said clip-actuating means move with said chuck means; and said clip-actuating means being so positioned on said chuck assembly as to cooperate with said clip means to accomplish movement of said inner portion of the clip means between said open and closed positions.

2. Apparatus as claimed in claim 1 wherein said clip-actuating means is movable relative to said chuck assembly.

3. Apparatus as claimed in claim 1 wherein chuck means is movable relative to said chuck assembly.

4. Apparatus as claimed in claim 1 wherein said clip-actuating means is movable relative to said chuck means in a sequence such that before movement of said chuck means to move a wafer to said clip means, said clip-actuating means first moves to actuate the clip means to said open position prior to insertion of a wafer.

5. Apparatus as claimed in claim 1 wherein said chuck means is a vacuum chuck centrally located on said chuck assembly, and said clip-actuating means is positioned radially outward of said chuck means.

6. Apparatus as claimed in claim 1 wherein said elevator means comprises a lift blade having arcuate upper end portions shaped to match the curvature of a wafer, and wherein said means for holding said wafer against gravity comprises a groove in each of said end portions shaped to match the thickness of a wafer and retain a wafer edgewise therein.

7. Apparatus as claimed claim 1 wherein said clip means include spring means adapted to move the clip means to said closed position and provide resilient support for a wafer when held by said clip means.

8. Apparatus as claimed in claim 7 wherein said support structure has an opening therein coaxial with said opening formed by said clip means.

9. Apparatus for moving generally circular relatively thin semiconductor wafers from a storage position to a position where wafers are loaded individually into a chamber, said apparatus comprising:

cassette means configured to hold a plurality of wafers oriented vertically and spaced from each other in a horizontal plane;

wafer elevator means supported for vertical movement and including means for holding a wafer against the force of gravity;

means for moving said elevator means into said cassette means to engage a wafer and then upwardly above the cassette means to a delivery position in which a wafer on the elevator means is elevated from said cassette means;

wall means forming a chamber having a vertically oriented opening for receiving wafers therethrough;

a door, wafer-holding chuck means mounted on and movable with the door adapted to receive a wafer from the elevator means and adapted to hold the received wafer on the inner side of said door and in substantially vertical orientation;

means for moving said door between first and second positions, said first position being such that said wafer-holding chuck means is positioned above a wafer in such cassette means to enable said chuck means to receive a wafer from said elevator means when said elevator means is moved upwardly to said delivery position; and said second position of said door being such that the door is closed to form a seal around said opening in said chamber and a wafer on said chuck means is positioned inside said opening.

10. Apparatus as claimed in claim 9 wherein said chuck means is movable relative to said door.

11. Apparatus as claimed in claim 9 further comprising means for moving said cassette means along a path below and substantially normal to the inner side of said door when the door is in said first position.

12. Apparatus as claimed in claim 9 wherein said elevator means comprises a lift blade having arcuate upper end portions shaped to match the curvature of a wafer, and wherein said means for holding said wafer against gravity comprises a groove in each of said end portions shaped to match the thickness of a wafer and retain a wafer edgewise therein.

13. Apparatus for transporting generally circular semiconductor wafers in an individual manner for wafer processing, said apparatus comprising:

storage means configured to support at least one wafer oriented vertically therein and upwardly removable therefrom;

vertically oriented blade means with a recessed configuration in the upper edge thereof for holding an individual wafer vertically;

means for positioning said blade means below said storage means;

means for causing relative movement between said blade means and said storage means in a vertical direction, whereby a wafer in said storage means can be removed from said storage means and held on said blade means above said storage means;

chuck means adapted to grasp and hold an individual wafer vertically and in a manner such that the center portion of one face of the wafer is untouched by said chuck means and is fully exposed;

said chuck means having a first position which enables said chuck means to grasp an individual wafer positioned outside said storage means on said blade means;

means for moving said chuck means to transport a wafer held thereon to a second position spaced from said first position to enable further processing of a wafer; and said chuck means holding the wafer while the chuck means is moved from the first position to the second position, whereby the wafer is transported by said chuck means from said first position to said second position.

14. Apparatus as claimed in claim 13 further comprising a chamber having an opening therein adapted to receive a wafer therethrough, and in which said means for moving said chuck means moves said chuck means away from said blade means and toward said chamber in a manner such that said second position is one wherein a wafer on said chuck means is positioned within said opening.

15. Apparatus as claimed in claim 14 wherein said chuck means includes a door portion adapted to close said opening when a wafer on said chuck means is positioned within said opening.

16. Apparatus as claimed in claim 13 further comprising a wafer carrier having wafer-holding means movable between an open position for receiving a wafer and a closed position for holding a wafer, and in which said means for moving said chuck means moves said chuck means away from said blade means and toward said wafer carrier in a manner such that said second position is one wherein a wafer on said chuck means can be transferred to the wafer-holding means on said wafer carrier.

17. Apparatus as claimed in claim 16 wherein said chuck means includes actuating means for moving said wafer-holding means to said open position prior to transferring a wafer from said chuck means to said wafer-holding means.

18. Apparatus for transferring a semiconductor member from a holding means to a chuck assembly, said apparatus comprising:

a chuck assembly comprising chuck means adapted to support a semiconductor member against the force of gravity;

holding means comprising a support structure, means on said support structure for gripping a semiconductor member, said gripping means being adapted for movement between a closed position for holding a semiconductor member and an open position for releasing a semiconductor member;

means for causing relative movement between said chuck means and said holding means such that a semiconductor member held by said gripping means in said closed position is engaged by said chuck means and removed from said gripping means when said gripping means is in said open position;

said chuck assembly having thereon actuating means adapted to contact said gripping means and cooperate therewith for moving the gripping means to said open position; and one of said chuck means and said actuating means being movable relative to the chuck assembly.

19. Apparatus as claimed in claim 18 wherein said actuating means is movably mounted on said chuck assembly, and means for moving said actuating means relative to said chuck assembly.

20. Apparatus as claimed in claim 18 wherein said chuck means is moveably mounted on said chuck assembly, and means for moving said chuck means relative to said chuck assembly.

21. Apparatus as claimed in claim 18 wherein said chuck means and said actuating means are both moveably mounted on said chuck assembly, and means for moving said chuck means and said actuating means relative one to the other.

22. Apparatus as claimed in claim 18 wherein said gripping means comprises clips spaced around a circle and each having a radially extending inner finger portion for gripping a semiconductor member, each said finger portion being connected to a radially extending outward support portion, and said actuating means being positioned on said chuck assembly for contacting said support portions of said clips.

23. Apparatus for moving semiconductor members from a storage position to a position where such members are loaded individually into a chamber, said apparatus comprising:

cassette means configured to hold a plurality of semiconductor members spaced from each other;

transfer means adapted to remove a semiconductor member from said cassette means and hold a semiconductor member against the force of gravity;

means for causing relative movement between said cassette means and said transfer means to remove a semiconductor member from said cassette means to a delivery position in which a semiconductor member on said transfer means is spaced from said cassette means;

wall means forming a chamber having an opening for receiving semiconductor members therethrough;

a door, chuck means mounted on and movable with the door adapted to hold a semiconductor member on the inner side of said door;

means for moving said door between first and second positions, said first position being such that said chuck means is enabled to receive a semiconductor member from said transfer means when a semiconductor member is held on said transfer means in said delivery position;

said second position of said door being such that the door is closed to form a seal around said opening in said chamber and a semiconductor member held on said door by said chuck means is positioned inside said opening; and means for moving said chuck means relative to said door in the direction along which said door moves.

* * * * *

UNITED STATES PATENT AND TRADEMARK OFFICE
CERTIFICATE OF CORRECTION

PATENT NO. : 4,647,266
DATED : March 3, 1987
INVENTOR(S) : George L. Coad, et al.

It is certified that error appears in the above-identified patent and that said Letters Patent are hereby corrected as shown below:

In the title: "WAFER COATING SYSTEM" should read --TRANSPORT SYSTEM FOR SUPERCONDUCTOR WAFERS --.

Col. 1, line 62, delete "function" and substitute --functions--;
line 64, delete "openng" and substitute --opening--.

Col. 2, line 6, delete "a" and substitute --the--; delete "the" and substitute --a--.

Col. 3, line 25, delete "load" (second occurrence), and substitute --lock--.

Col. 5, line 7, delete "relability" and substitute --reliability--.

Col. 7, line 29, delete "indvidual" and substitute --individual--.

Col. 10, line 35, delete "loded" and substitute --loaded--;
line 42, after "For", insert --example,--.

Col. 11, line 62, Claim 1, delete "menas" and substitute --means--.

UNITED STATES PATENT AND TRADEMARK OFFICE
CERTIFICATE OF CORRECTION

PATENT NO. : 4,647,266
DATED : March 3, 1987
INVENTOR(S) : George L. Coad, et al It is certified that error appears in the above-identified patent and that said Letters Patent is hereby corrected as shown below:

Col. 13, line 7, Claim 9, delete "such" and substitute -- said --.

Signed and Sealed this

First Day of September, 1987

Attest:

DONALD J. QUIGG

Attesting Officer

Commissioner of Patents and Trademarks